(12) United States Patent
Cook et al.

(10) Patent No.: US 10,354,890 B2
(45) Date of Patent: *Jul. 16, 2019

(54) PACKAGED SEMICONDUCTOR DEVICE HAVING NANOPARTICLE ADHESION LAYER PATTERNED INTO ZONES OF ELECTRICAL CONDUCTANCE AND INSULATION

(71) Applicant: TEXAS INSTRUMENTS INCORPORATED, Dallas, TX (US)

(72) Inventors: Benjamin Stassen Cook, Addison, TX (US); Yong Lin, Troy, MI (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/864,919

(22) Filed: Jan. 8, 2018

(65) Prior Publication Data
US 2018/0182693 A1  Jun. 28, 2018

Related U.S. Application Data

(63) Continuation of application No. 15/388,616, filed on Dec. 22, 2016, now Pat. No. 9,865,527.

(51) Int. Cl.
H01L 23/495 (2006.01)
H01L 21/56 (2006.01)
H01L 23/31 (2006.01)

(52) U.S. Cl.
CPC ........ *H01L 21/565* (2013.01); *H01L 23/3121* (2013.01); *H01L 23/3142* (2013.01);
(Continued)

(58) Field of Classification Search
CPC ........... H01L 23/3121; H01L 23/49582; H01L 24/17; H01L 24/19; H01L 21/4821; H01L 21/565; H01L 23/293
See application file for complete search history.

(56) References Cited

U.S. PATENT DOCUMENTS 4,637,990 A  1/1987 Torobin
5,073,459 A  12/1991 Smarsly et al.
(Continued)

FOREIGN PATENT DOCUMENTS

EP  2924719  9/2015
WO  2008068873 A1  6/2008
(Continued)

*Primary Examiner* — Brook Kebede
(74) *Attorney, Agent, or Firm* — Ronald O. Neerings; Charles A. Brill; Frank D. Cimino (57) ABSTRACT

A device comprises a substrate and an adhesive nanoparticle layer patterned into zones of electrical conductance and insulation on top of the substrate surface. A diffusion region adjoining the surface comprises an admixture of the nanoparticles in the substrate material. When the nanoparticle layer is patterned from originally all-conductive nanoparticles, the insulating zones are created by selective oxidation; when the nanoparticle layer is patterned from originally all-non-conductive nanoparticles, the conductive zones are created by depositing selectively a volatile reducing agent. A package of insulating material is in touch with the nanoparticle layer and fills any voids in the nanoparticle layer.

20 Claims, 9 Drawing Sheets

(52) U.S. Cl.
CPC ............ *H01L 23/49582* (2013.01); *H01L 2224/16245* (2013.01); *H01L 2224/32245* (2013.01); *H01L 2224/48091* (2013.01); *H01L 2224/48247* (2013.01); *H01L 2224/48465* (2013.01); *H01L 2224/49171* (2013.01); *H01L 2224/73265* (2013.01)

(56) References Cited

U.S. PATENT DOCUMENTS

| | | |
|---|---|---|
| 5,682,075 A | 10/1997 | Bolleman et al. |
| 6,107,216 A | 8/2000 | Kennedy et al. |
| 6,330,916 B1 | 12/2001 | Rickards et al. |
| 7,589,439 B2 | 9/2009 | Raisanen |
| 8,178,976 B2 | 5/2012 | Dunne et al. |
| 8,647,979 B2 | 2/2014 | Yaniv et al. |
| 8,728,991 B2 | 5/2014 | Wu et al. |
| 8,815,648 B1 | 8/2014 | Aoya et al. |
| 9,236,169 B2 | 1/2016 | Hong et al. |
| 9,305,869 B1 | 4/2016 | Zhang et al. |
| 2002/0150821 A1 | 10/2002 | Fukuda et al. |
| 2003/0134084 A1 | 7/2003 | Ichikawa et al. |
| 2004/0110059 A1 | 6/2004 | Onishi et al. |
| 2004/0137209 A1 | 7/2004 | Zeller et al. |
| 2004/0161596 A1 | 8/2004 | Taoka et al. |
| 2004/0214452 A1 | 10/2004 | Freeman |
| 2005/0009353 A1 | 1/2005 | Coomer et al. |
| 2005/0048758 A1* | 3/2005 | Hosseini .............. B23K 1/0016 438/614 |
| 2005/0109617 A1 | 5/2005 | Ono et al. |
| 2006/0163744 A1 | 7/2006 | Vanheusden et al. |
| 2006/0211802 A1 | 9/2006 | Asgari |
| 2006/0266714 A1 | 11/2006 | Olson, III et al. |
| 2006/0275649 A1 | 12/2006 | Keller et al. |
| 2007/0001319 A1 | 1/2007 | Bauer |
| 2007/0087268 A1 | 4/2007 | Kim et al. |
| 2007/0114138 A1 | 5/2007 | Krasteva et al. |
| 2007/0163643 A1 | 7/2007 | Van Duren et al. |
| 2007/0201122 A1 | 8/2007 | Dozeman et al. |
| 2008/0081157 A1 | 4/2008 | Schneegans et al. |
| 2008/0105853 A1 | 5/2008 | Ueda et al. |
| 2008/0106853 A1 | 5/2008 | Suenaga |
| 2008/0145607 A1 | 6/2008 | Kajiwara et al. |
| 2008/0213611 A1 | 9/2008 | Asgari |
| 2008/0272344 A1 | 11/2008 | Jiang et al. |
| 2008/0286488 A1 | 11/2008 | Li et al. |
| 2009/0020865 A1 | 1/2009 | Su |
| 2009/0045907 A1 | 2/2009 | Hoidis et al. |
| 2009/0047485 A1 | 2/2009 | Ofir et al. |
| 2009/0096100 A1 | 4/2009 | Kajiwara et al. |
| 2009/0159121 A1 | 6/2009 | Yang et al. |
| 2009/0189264 A1 | 7/2009 | Yato |
| 2009/0211638 A1 | 8/2009 | Park et al. |
| 2009/0274833 A1 | 11/2009 | Li et al. |
| 2010/0055302 A1 | 3/2010 | Kim et al. |
| 2010/0155496 A1 | 6/2010 | Stark et al. |
| 2010/0171064 A1 | 7/2010 | Shim et al. |
| 2010/0187678 A1 | 7/2010 | Kajiwara et al. |
| 2010/0196681 A1 | 8/2010 | Song et al. |
| 2011/0124252 A1 | 5/2011 | Shimomura et al. |
| 2011/0160104 A1 | 6/2011 | Wu et al. |
| 2011/0209751 A1 | 9/2011 | Nojiri |
| 2011/0300305 A1 | 12/2011 | Li et al. |
| 2012/0015147 A1 | 1/2012 | Maa et al. |
| 2012/0089180 A1 | 4/2012 | Fathi et al. |
| 2012/0115271 A1 | 5/2012 | Holliman et al. |
| 2012/0119342 A1 | 5/2012 | Chang Chien et al. |
| 2012/0144958 A1 | 6/2012 | Olson, III et al. |
| 2012/0153216 A1 | 6/2012 | Wrosch |
| 2012/0175147 A1 | 7/2012 | Nakako et al. |
| 2012/0186644 A1 | 7/2012 | Ko et al. |
| 2012/0251736 A1 | 10/2012 | Hong et al. |
| 2013/0040204 A1 | 2/2013 | Oeschler et al. |
| 2013/0136645 A1 | 5/2013 | Sekine et al. |
| 2014/0048749 A1 | 2/2014 | Lockett et al. |
| 2014/0120356 A1 | 5/2014 | Shearer et al. |
| 2014/0131898 A1 | 5/2014 | Shearer et al. |
| 2014/0166098 A1 | 6/2014 | Kian et al. |
| 2014/0205918 A1 | 7/2014 | Schuh et al. |
| 2014/0249058 A1 | 9/2014 | Wu et al. |
| 2014/0264383 A1 | 9/2014 | Kajiwara et al. |
| 2014/0284779 A1 | 9/2014 | Hayata et al. |
| 2015/0069611 A1 | 3/2015 | Martin et al. |
| 2015/0070752 A1 | 3/2015 | Sadlik et al. |
| 2015/0123263 A1 | 5/2015 | Frueh et al. |
| 2015/0173200 A1 | 6/2015 | Kim et al. |
| 2015/0179478 A1* | 6/2015 | Xiu ....................... H01L 21/563 257/737 |
| 2015/0214095 A1 | 7/2015 | Mischitz et al. |
| 2015/0217411 A1 | 8/2015 | Ishikawa et al. |
| 2015/0243402 A1 | 8/2015 | Cho et al. |
| 2016/0005671 A1 | 1/2016 | Tsuyuno et al. |
| 2016/0093558 A1 | 3/2016 | Cook et al. |
| 2016/0211083 A1 | 7/2016 | Kanatzidis et al. |
| 2016/0256807 A1 | 9/2016 | Gao et al. |
| 2016/0286654 A1 | 9/2016 | Romig et al. |
| 2016/0372693 A1 | 12/2016 | Kumaki et al. |
| 2016/0381844 A1 | 12/2016 | Knox et al. |
| 2017/0004978 A1 | 1/2017 | Hwang et al. |
| 2017/0181291 A1 | 6/2017 | Bell et al. |
| 2017/0213615 A1 | 7/2017 | Okada et al. |
| 2017/0216923 A1 | 8/2017 | Babenko et al. |
| 2017/0294397 A1 | 10/2017 | Croteau et al. |
| 2017/0305743 A1 | 10/2017 | Sekine |
| 2017/0309549 A1 | 10/2017 | Wachtler et al. |
| 2018/0138110 A1 | 5/2018 | Cook |
| 2018/0166369 A1 | 6/2018 | Cook |
| 2018/0182693 A1 | 6/2018 | Cook |

FOREIGN PATENT DOCUMENTS

| | | |
|---|---|---|
| WO | 2009097627 | 6/2009 |
| WO | 2014150089 | 9/2014 |

\* cited by examiner

PACKAGED SEMICONDUCTOR DEVICE HAVING NANOPARTICLE ADHESION LAYER PATTERNED INTO ZONES OF ELECTRICAL CONDUCTANCE AND INSULATION

This application is a Continuation of application Ser. No. 15/388,616 filed Dec. 22, 2016.

FIELD

Embodiments of the present invention are related in general to the field of semiconductor devices and processes, and more specifically to the structure and fabrication of packaged semiconductor devices having patterned conductance single-material nanoparticle adhesion layers.

DESCRIPTION OF RELATED ART

Based on their functions, semiconductor packages include a variety of different materials. Metals formed as leadframes are employed for mechanical stability and electrical and thermal conductance. Insulators, such as polymeric molding compounds, are used for encapsulations and form factors. In packaging fabrication, it is common to attach a plurality of semiconductor chips to a strip of a leadframe to connect the semiconductor chips to their respective leads and then to encapsulate the assembled chips in packages. The encapsulated packages protect the enclosed parts against mechanical damage and environmental influences such as moisture and light. After the encapsulation step, the packaged chips are separated from the leadframe strip (or packaging substrate) into discrete units by a trimming and forming step.

A encapsulation technique is transfer molding method. A leadframe strip with attached and connected chips is placed into a mold, which forms a cavity around each assembled chip. A semi-viscous thermoset polymeric compound is pressured through runners across the leadframe strip to enter each cavity through a gate. After filling the cavities, the compound is allowed to harden by polymerization. Finally, in the degating step, the compound in the runner is broken off at each gate from the compound filling the cavity.

To ensure the unity and coherence of the package, the metallic and non-metallic materials are expected to adhere to each other during the lifetime of the product, while tolerating mechanical vibrations, temperature swings, and moisture variations. Failing adhesion would allow moisture ingress into the package, causing device failure by electrical leakage and chemical corrosion.

Today's semiconductor technology employs a number of methods to improve adhesion between diversified materials. Among the methods are chemically purifying the molding compounds, activating leadframe metal surfaces for instance by plasma just prior to the molding process, and enhancing the affinity of leadframe metals to polymeric compounds by oxidizing the base metal. Furthermore, design features such as indentations, grooves or protrusions, overhangs and other three-dimensional features are added to the leadframe surface for improved interlocking with the package material.

Another example of known technology to improve adhesion between leadframe, chip, and encapsulation compound in semiconductor packages is the roughening of the whole leadframe surface by chemically etching the leadframe surface after stamping or etching the pattern from a metal sheet. Chemical etching is a subtractive process using an etchant. Chemical etching creates a micro-crystalline metal surface with a roughness on the order of 1 µm or less. To roughen only one surface of the leadframe adds about 10 to 15% cost to the non-roughened leadframe.

Yet another known method to achieve a rough surface is the use of a specialized metal plating bath, such as a nickel plating bath, to deposit a rough metal (such as nickel) layer. This method is an additive process; the created surface roughness is on the order of 1 to 10 µm. Roughening of the leadframe surface may have some unwelcome side effects. General roughening of the surface impacts wire bonding negatively, since vision systems have trouble seeing the roughened surface. The rough surface shortens capillary life, and micro-contaminants on the rough surface degrades bonding consistency. General rough surfaces tend to allow more bleeding, when the resin component separates from the bulk of the chip attach compound and spreads over the surface of the chip pad. The resin bleed, in turn, can degrade moisture level sensitivity and interfere with down bonds on the chip pad.

The success of all these efforts has only been limited, especially because the adhesive effectiveness is diminishing ever more when another downscaling step of device miniaturization is implemented.

SUMMARY

A device comprises a substrate (201) and an adhesive nanoparticle layer (400, 900) patterned into zones of electrical conductance and insulation on top of the substrate surface (201a). A diffusion region adjoining the surface comprises an admixture of the nanoparticles in the substrate material. When the nanoparticle layer is patterned from originally all-conductive nanoparticles (302), the insulating zones are created by selective oxidation (500). When the nanoparticle layer is patterned from originally all-non-conductive nanoparticles (1002), the conductive zones are created by depositing selectively a volatile reducing agent (1200). An insulating material is added to contact the nanoparticle layer and fill pores/voids in the nanoparticle layer.

DETAILED DESCRIPTION OF THE PREFERRED EMBODIMENTS

Figure 1:
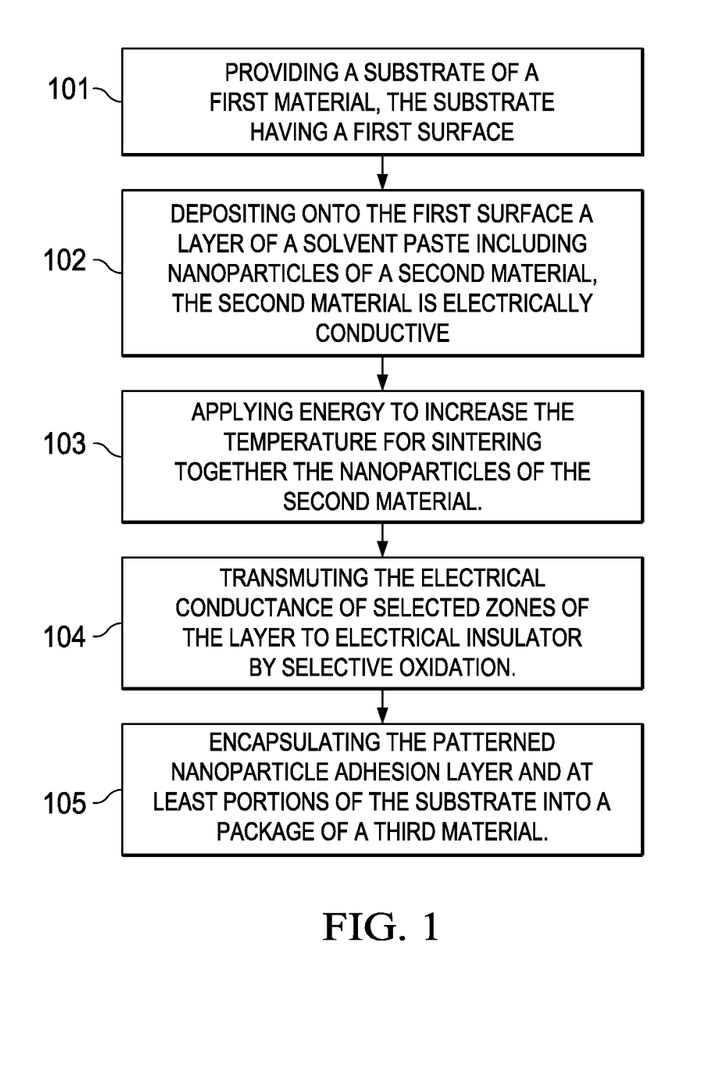
FIG. 1 is a diagram illustrating the process of creating an additive layer of electrically conductive nanoparticles and transmuting the electrical conductance of selected zones to electrical insulator according to an embodiment of the invention.
Figure 7:
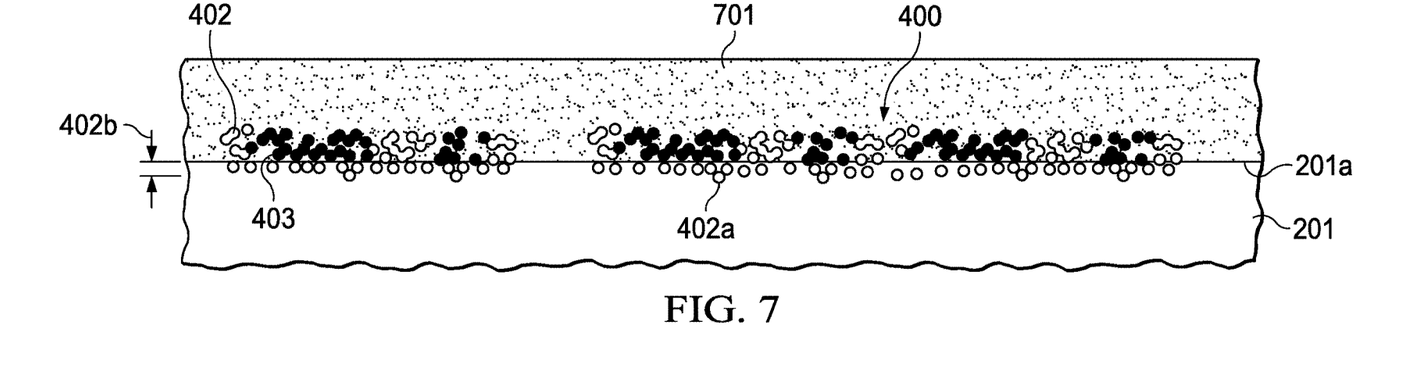
FIG. 7 illustrates the encapsulation of the additive layer by a packaging compound, which fills the voids of the additive layer according to an embodiment of the invention.
Figure 8:
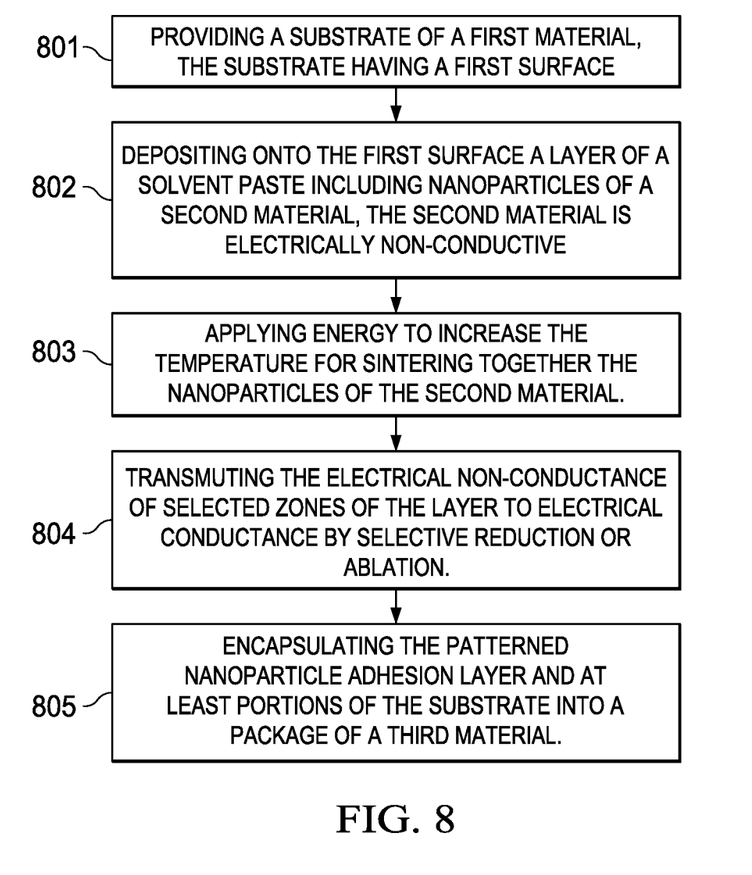
FIG. 8 is a diagram illustrating the process of creating an additive layer of electrically non-conductive nanoparticles and transmuting the electrical non-conductance of selected zones to electrical conductance according to an embodiment of the invention.

In an embodiment of the invention, a method for enhancing the adhesion and mechanical bonding between objects made of diverse materials such as metals and polymerics is described. The method comprises the formation of an additive adhesion layer composed of intermeshed nanoparticle layers between the objects. FIGS. 1 and 8 are diagrams illustrating embodiments of the invention. An object, onto which the additive film is constructed, is herein referred to as substrate, while another object, which needs adhesion to the substrate, is herein referred to as a package. As examples, a substrate is denoted 201 in FIG. 2, and a package is denoted 701 in FIG. 7.

Applications of the process shown in FIG. 1 (and in FIG. 8) can be applied to the fabrication of semiconductor devices. In semiconductor technology, the substrate typically is either a metallic leadframe or a laminated substrate composed of a plurality of alternating electrically insulating and electrically conductive layers. During step 101 of the process shown in FIG. 1, a substrate is selected, which is made of a first material and has a surface.

When the substrate is a leadframe (for example see FIG. 15), the leadframe is usually etched or stamped from a thin sheet of base metal such as copper, copper alloy, iron-nickel alloy, aluminum, Kovar™, and others, in a typical thickness range from 120 to 250 µm. As used herein, the term base metal has the connotation of starting material and does not imply a chemical characteristic. Some leadframes may have additional metal layers plated onto the complete or the partial surface areas of the base metal; examples are plated nickel, palladium, and gold layers on copper leadframes.

A leadframe provides a support pad (1501 in FIG. 15) for firmly positioning the semiconductor chip (1510). Further, a leadframe offers a multitude of conductive leads (1503) to bring various electrical conductors into close proximity of the chip. Any remaining gap between the tip of the leads and the chip terminals is typically bridged by thin bonding wires (1530); alternatively, in flip-chip technology the chip terminals may be connected to the leads by metal bumps. For the leadframe, the desired shape of pad, leads, and other geometrical features are etched or stamped from the original metal sheet.

Besides chemical affinity between the molding compound and the metal finish of a leadframe, adhesion may necessitate leadframe surface roughness, especially in view of the technical trend of shrinking package dimensions, which offers less surface area for adhesion. In addition, the requirement to use lead-free solders pushes the reflow temperature range into the neighborhood of about 260° C., making it more difficult to maintain mold compound adhesion to the leadframes at elevated temperatures.

Figures 2, 3:
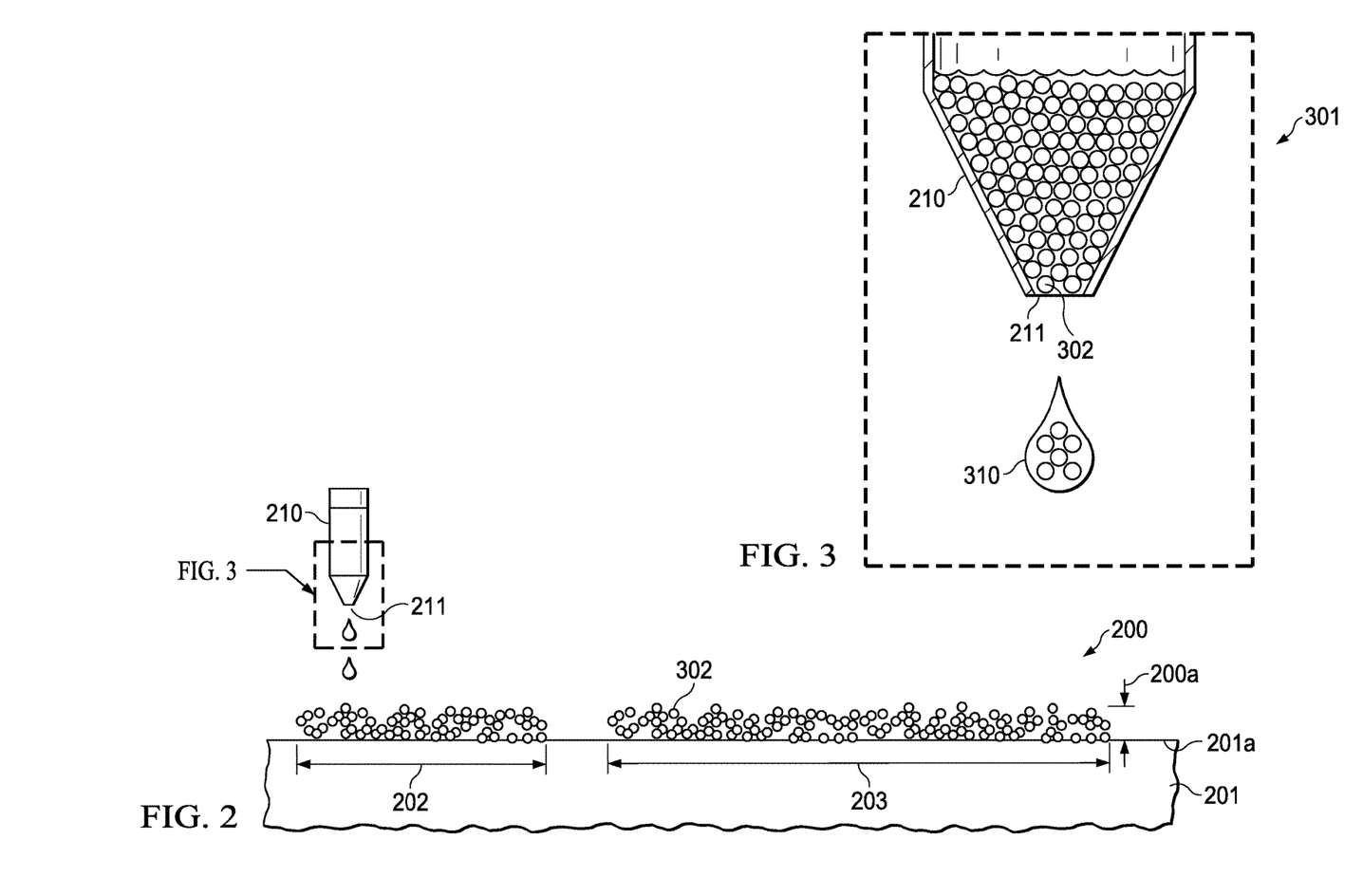
FIG. 2 is a diagram illustrating the formation of an additive adhesion layer of electrically conductive nanoparticles according to an embodiment of the invention.
FIG. 3 illustrates an enlargement of a portion of the syringe with a nozzle of an inkjet printer, wherein the syringe is filled with a paste mixed with electrically conductive nanoparticles in a solvent according to an embodiment of the invention.

Referring to the process of FIG. 1, during step 102 of the process, layer (designated 200 in FIG. 2) of a solvent paste is deposited onto the first surface 201a of substrate 201. The solvent paste comprises a solvent or dispersant including nanoparticles of a second material, which is electrically conductive. An example of the solvent paste is illustrated in FIG. 3 and designated 301. The nanoparticles, dissolved on the dispersant, are referred to as nanoparticles 302.

Nanoparticles, as used herein, includes spherical or other three-dimensional clusters composed of atoms or molecules, of inorganic or organic chemical compounds, of one-dimensional wires, of two-dimensional crystals and platelets, and of nanotubes. Furthermore, the surfaces of the nanoparticles may be functionalized against aggregation, or for improving the adhesion of the nanoparticles. The functionalization can be achieved by attaching ligand molecules to the core of the nanoparticles. Examples of hydrophobic ligand molecules include trioctylphosphine oxide (TOPO), triphenylphosphine (TPP), dodecanethiol (DDT), tetraoctylammonium bromide (TOAB), and oleic acid (OA). Examples of hydrophilic ligand molecules include mercaptoacetic acid (MAA), mercaptopropionic acid (MPA), mercaptoundecanoic acid (MUA), mercaptosuccinic acid (MSA), dihydrolipic acid (DHLA), bis-sulphonated triphenylphosphine (mPEG$_5$-SH, mPEG$_{45}$-SH), and short peptide of sequence CALNN.

The second material may be selected from a group including metals, metallized plastics, and metallized ceramics. The metals may include gold, silver, copper, aluminum, tin, zinc, and bismuth.

During step 103 of the process of FIG. 1, a layer 200 of the solvent paste 301, which includes electrically conductive nanoparticles 302 of the second material, is deposited on the surface 201a of the substrate 201 shown in FIG. 2. Surface 201a is referred to as first surface. Layer 200 may extend over the available two-dimensional surface area, or it may cover only portions of the surface area such as islands between about 0.1 µm to 100 µm dependent on the drop size of the solvent paste. Examples of a few islands are designated 202 and 203 in FIG. 2. In metallic leadframes, layer 200 may cover the whole leadframe surface area of one or more leads, or selected parts such as the chip attach pad. Building up height from compiled drops of repeated runs of syringe 210, layer 200 may preferably have a height 200a between about 100 nm and 500 nm, but may be thinner or considerably thicker.

The equipment for depositing the solvent paste includes a computer-controlled inkjet printer with a moving syringe 210 with nozzle 211, from which discrete drops 310 of the paste are released. Automated inkjet printers can be selected from a number of commercially available printers. Alternatively, a customized inkjet printer can be designed to work for specific pastes. Alternatively, any additive method can be used including inkjet printing, screen printing, gravure printing, dip coating, spray coating, and many others.

Figure 4:
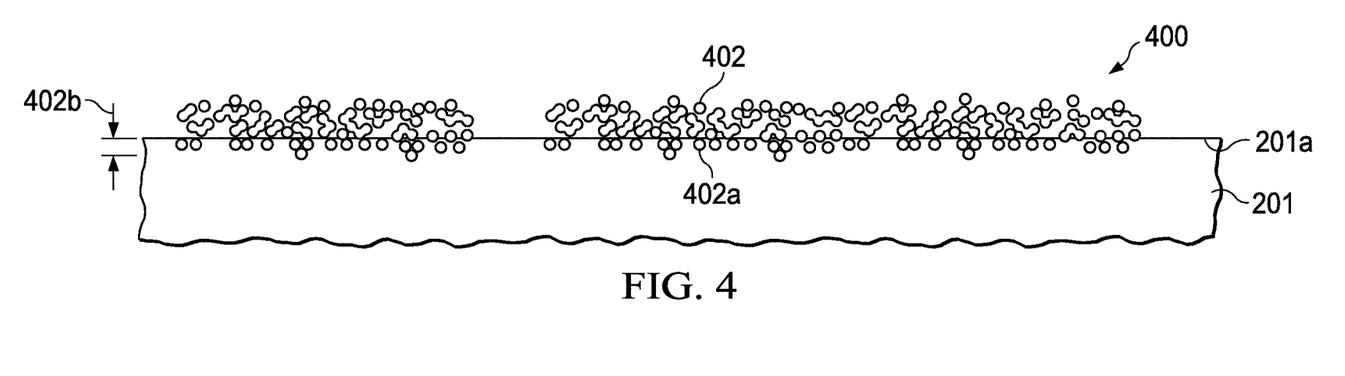
FIG. 4 illustrates an additive layer after sintering the electrically conductive nanoparticles, and after the concurrent diffusion of molecules of the nanoparticle material into the subsurface region of the substrate according to an embodiment of the invention.

During step 103 of the process of FIG. 1, energy is provided to elevate the temperature for sintering together the nanoparticles of the second material and concurrently for diffusing second material into the substrate region adjoining the first surface, thereby anchoring the sintered nanoparticles of the second material to the first surface. The needed energy may be provided by a plurality of sources: thermal energy, photonic energy, electromagnetic energy, and chemical energy. When sintering together, the nanoparticles 302 are necking between the particles into a liquid network structure 402, as indicated in FIG. 4. The layer 400 of the liquid network structure 402 is electrically conductive.

Concurrent with the sintering of the nanoparticles 402 of the second material, some second material is diffusing by atomic interdiffusion into the first material of the region adjoining the surface 201a (first surface) of substrate 201. The second material diffused into the surface-near region of substrate 201 does not create electrical conductance in the region adjoining surface 210a of substrate 201. In FIG. 4, the second material interdiffused into the region near surface 201a of substrate 201 is designated 402a. The diffusion depth is designated 402b in FIG. 4. The atomic interdiffusion into the substrate creates an interdiffusion bond, which anchors layer 400 of sintered second nanoparticles into substrate 201.

There are several reasons why it may be desirable to transform the electrical conductance of selected portions of layer 400. As an example, when the conductive nanoparticle layer has poorer adhesion to the molding compound to be employed for the package than a non-conductive layer (for example, copper nanoparticles compared to copper oxide nanoparticles), and when it is sufficient to use the conductive nanoparticles only where conductive regions of the surface are required while non-conductive nanoparticles could offer higher adhesion to the molding compound, the net adhesion could be improved by transforming selected regions to the state of electrical non-conductance.

As another example, some circuitry may benefit from local thermal isolation, or electrical isolation, or magnetic isolation for selected portions of the circuitry. As yet another example, in devices where the substrate as well as the package have non-conductive surfaces, selected traces of the adhesive and electrically conductive nanoparticle layer may be used for signal routing.

During step 104 of the process of FIG. 1, the electrical conductance of selected zones of layer 400 is transformed, or transmuted, to electrical insulator by selective oxidation. As an example, if layer 400 is made of sintered copper nanoparticles, the nanoparticles of selected zones are transmuted to copper oxide (CuO, $Cu_2O$, and other copper oxidation stages).

The most suitable selective technique and equipment may be selected from a group including heating, exposing to oxidizing atmosphere, exposing to oxidizing substances or chemicals, and depositing a volatile oxidizing agent. As an example, the copper nanoparticles of selected traces of layer 400 may be treated with focused light or laser in an oxidizing environment. As another example, the exposure to oxidizing agent may be enabled by masks.

Figure 5:
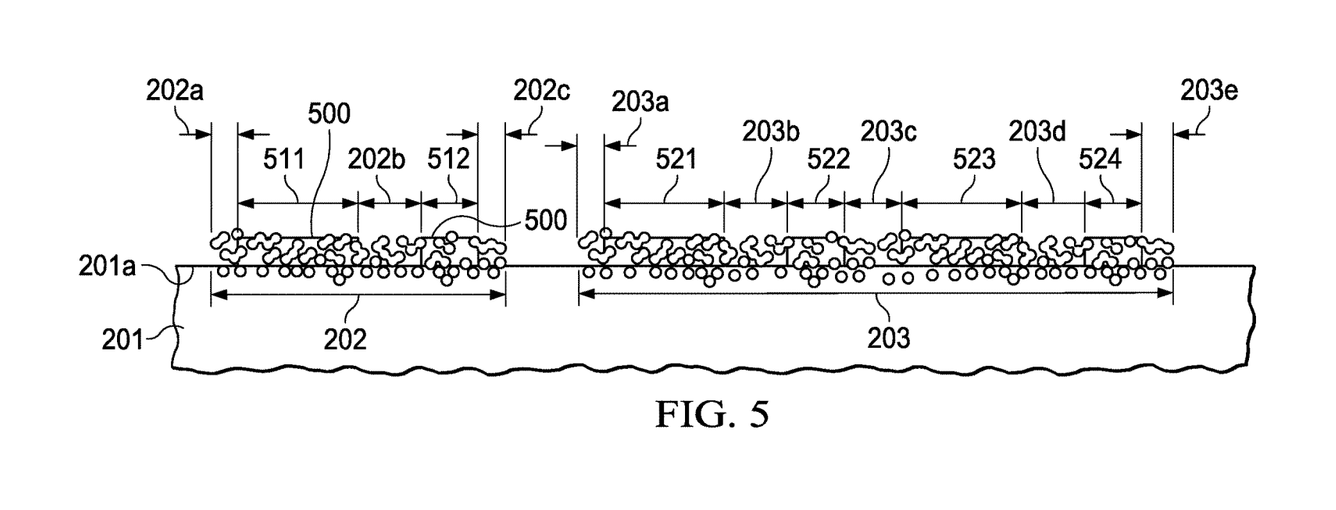
FIG. 5 illustrates the transmutation of the electrical conductance of selected zones of the sintered nanoparticle layer into electrical non-conductance, or insulator, by depositing a volatile oxidizing agent according to an embodiment of the invention.
Figure 6:
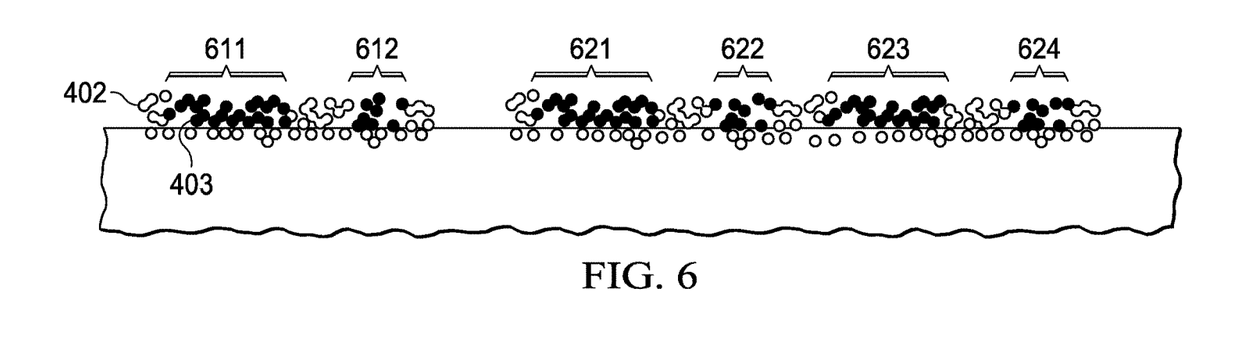
FIG. 6 illustrates the completed transmutation in selected zones of sintered electrically conductive nanoparticles into sintered electrically insulating nanoparticles according to an embodiment of the invention.

FIGS. 5 and 6 illustrate an example of a selective deposition, or deposition through a mask, of a chemical agent, followed by evaporation of the agent. In FIG. 5, islands (of lengths 202 and 203) of sintered electrically conductive nanoparticles 402 have been formed on surface 201a of substrate 201. In this example, a volatile oxidizing agent 500 is selectively deposited in zones designated 511 and 512 of the nanoparticle island of length 202, and zones 521, 522, 523, and 524 of the nanoparticle island of length 203. As FIG. 5 shows, oxidizing agent 500 is distributed between, and surrounds, the sintered nanoparticles 402 of the selected zones. Only certain other zones of the original conductive nanoparticles 402 remain conductive; in island 202, the remaining conductive zones are designated 202a, 202b, and 202c, and in island 203, they are designated 203a, 203b, 203c. 203d, and 203e.

In FIG. 6, the transmutation, or transformation, of nanoparticles in selected zones has been completed from the original electrically conductive characteristic to electrically non-conductive characteristic. The sintered nanoparticles marked 402 are still in their electrically conductive state, while the sintered nanoparticles 403 in zones 611, 612, 621, 622, 623, and 624 are in the electrically non-conductive state; the nanoparticles in those zones may now be called insulators. The volatile material 500, which served as the oxidizing agent, is eliminated for instance by evaporation. By the selective oxidation process, a nanoparticle adhesion layer is created, which is patterned into contiguous zones of electrical conductance and electrical insulation.

During step 105 of the process shown in FIG. 1, the solid patterned nanoparticle layer, together with at least portions of the substrate 201 of first material, are encapsulated into a package of a fourth material, preferably a polymeric compound. The process is illustrated in FIG. 7, wherein the polymeric compound is denoted 701. A method for encapsulation by a polymeric compound is transfer molding technology using a thermoset epoxy-based molding compound. Since the compound has low viscosity at the elevated temperature during the molding process, the polymeric compound can readily fill any pores/voids of the patterned nanoparticle adhesion layer. The filling of the pores/voids by polymeric material takes place for any pores/voids, whether they are arrayed in an orderly pattern or in a random distribution, and whether they are shallow or in a random three-dimensional configuration including pores/voids resembling spherical caverns with narrow entrances.

After the compound has polymerized and cooled down to ambient temperature, the polymeric compound 701 in the package as well as in the pores/voids is hardened. After hardening of the plastic material, the polymeric-filled pores/voids represent a strong anchor of the package in the patterned nanoparticle layer, giving strength to the interface of package (fourth material) and the patterned nanoparticle film layer. In addition, as mentioned above, the nanoparticle layer is anchored in metallic substrate 201 by metal interdiffusion 402a. Together, the overall adhesion between the plastic package 701 and the metallic substrate 201 is improved while the adhesive nanoparticle layer offers selective electrical conductance for signal routing. Adhesion improvements of an order of magnitude have been measured.

The method illustrated in FIGS. 8 to 14 is another embodiment of the invention to enhance the adhesion between objects made of diverse materials. The method comprises the formation and anchoring of an additive nanoparticle adhesion layer between the objects, wherein the layer includes an array of electrically conductive and non-conductive zones and the application benefits from the better adhesion of the electrically non-conductive areas. An example is the better adhesion the molding compound of copper oxide nanoparticles compared to metallic copper nanoparticles. In these cases, it is advantageous to use conductive nanoparticles only where conductive surface zones are required, while otherwise non-conductive nanoparticles are employed to enhance the net adhesion across the surface.

During step 801 of the process of FIG. 8, a substrate is selected, which is made of a first material and has a surface extending in two dimensions; herein, the surface is referred to as first surface. For semiconductor devices, the substrate is frequently a metallic leadframe as described above.

Figures 9, 10:
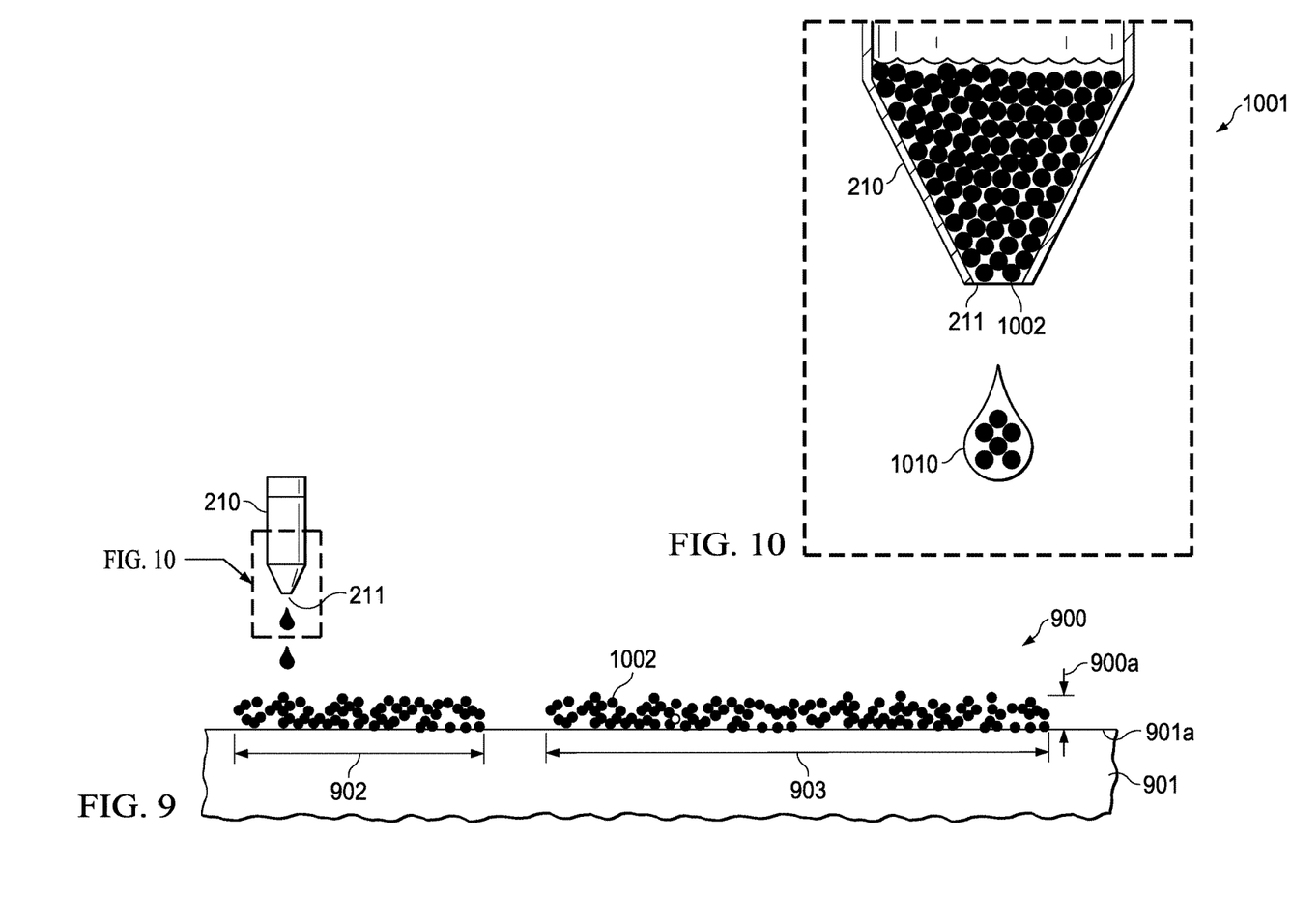
FIG. 9 illustrates the formation of an additive adhesion layer of electrically non-conductive nanoparticles according to an embodiment of the invention.
FIG. 10 illustrates an enlargement of a portion of the syringe with a nozzle of an inkjet printer, wherein the syringe is filled with a paste mixed with electrically non-conductive nanoparticles in a solvent according to an embodiment of the invention.

During step 802 of the process of FIG. 8, a layer 900 of a solvent paste is additively deposited onto the first surface 901*a* of substrate 901. The solvent paste comprises a solvent or dispersant including nanoparticles of a second material, which is electrically non-conductive. An example of the solvent paste is illustrated in FIG. 10 and designated 1001. The electrically non-conductive nanoparticles, dissolved on the dispersant, are referred to as nanoparticles 1002 of a second material.

Nanoparticles includes spherical or other three-dimensional clusters composed of atoms or molecules, of inorganic or organic chemical compounds, of one-dimensional wires, of two-dimensional crystals and platelets, and of nanotubes. Furthermore, the surfaces of the nanoparticles may be functionalized against aggregation, or for improving the adhesion of the nanoparticles of the second material. The functionalization can be achieved by attaching hydrophobic or hydrophilic ligand molecules to the core of the nanoparticles.

The third material may be selected from a group including metal oxides, metal nitrides, metal carbides, ceramics, plastics, polymers, and conducting nanoparticles coated with oxides, polymers, ceramics, and other con-conducting compounds and molecules.

During step 803 of the process of FIG. 8, a layer 900 of the solvent paste 1001, which includes electrically non-conductive nanoparticles 1002 of the second material, is additively deposited on the two-dimensional surface 901*a* of the substrate 901 shown in FIG. 9. Surface 901*a* is referred to as first surface. Layer 900 may extend over the available two-dimensional surface area, or it may cover only portions of the surface area such as islands between about 0.1 µm to 100 µm dependent on the drop size of the solvent paste. Examples of a few islands are designated 902 and 903 in FIG. 9. In metallic leadframes, layer 900 may cover the whole leadframe surface area of one or more leads, or selected parts such as the chip attach pad. Building up height from compiled drops 1010 of repeated runs of syringe 210, layer 900 may preferably have a height 900*a* between about 100 nm and 500 nm, but may be thinner or considerably thicker.

The equipment for depositing the solvent paste includes a computer-controlled inkjet printer with a moving syringe 210 with nozzle 211, from which discrete drops 1010 of the paste are released. Alternatively, any additive method can be used including inkjet printing, screen printing, gravure printing, dip coating, spray coating, and many others.

Figure 11:
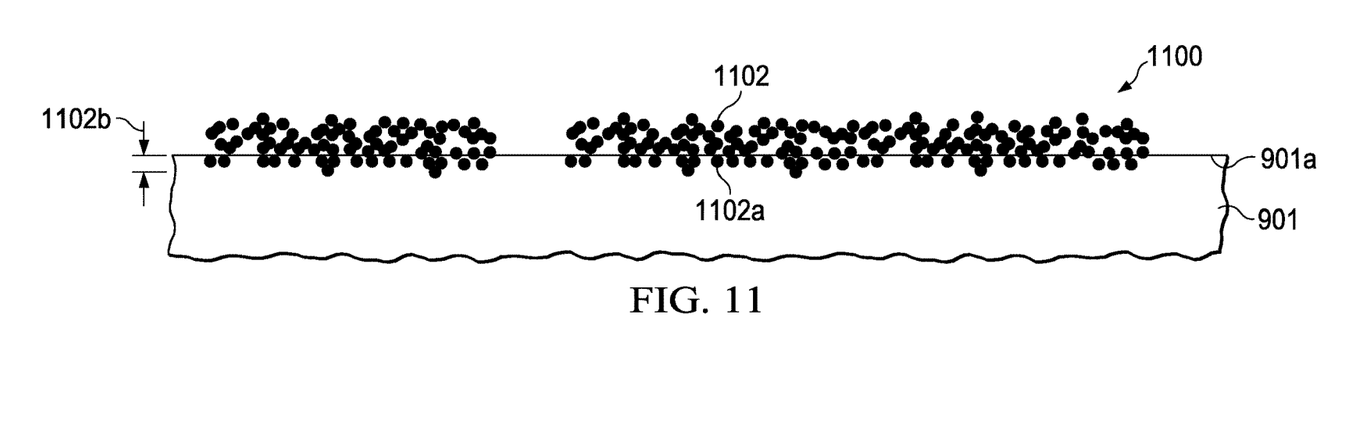
FIG. 11 illustrates an additive layer after sintering the electrically non-conductive nanoparticles, and after the concurrent diffusion of molecules of the nanoparticle material into the subsurface region of the substrate according to an embodiment of the invention.

During step 803 of the process of FIG. 8, energy is provided to elevate the temperature for sintering together the nanoparticles of the second material and concurrently for diffusing second material into the substrate region adjoining the first surface, thereby anchoring the sintered nanoparticles of the second material to the first surface. The needed energy may be provided by a plurality of sources: thermal energy, photonic energy, electromagnetic energy, and chemical energy. When sintering together, the nanoparticles 1002 are necking between the particles into a liquid network structure 1102, as indicated in FIG. 11. The layer 1100 of the liquid network structure 1102 is electrically non-conductive.

Concurrent with the sintering of the nanoparticles 1102 of the second material, some second material is diffusing by atomic interdiffusion into the first material of the region adjoining the surface 901*a* (first surface) of substrate 901. In FIG. 4, the second material interdiffused into the region near surface 901*a* of substrate 901 is designated 1102*a*. The diffusion depth is designated 1102*b*. The atomic interdiffusion into the substrate creates an interdiffusion bond, which anchors layer 1100 of sintered second nanoparticles into substrate 901.

During step 804 of the process of FIG. 8, the electrical non-conductance of selected zones of layer 1100 is transformed, or transmuted, to electrical conductance by selective reduction or ablation. As an example, if layer 1100 is made sintered copper oxide nanoparticles or polymer-coated conductive nanoparticles, the nanoparticles of selected zones are transmuted by depositing a reducing agent selectively, or by selectively exposing the non-conductive nanoparticles to a reducing atmosphere, for instance formic acid HCOOH, preferably by using a mask. In another method, selective heating may be used to ablate non-conductive coatings.

Figure 12:
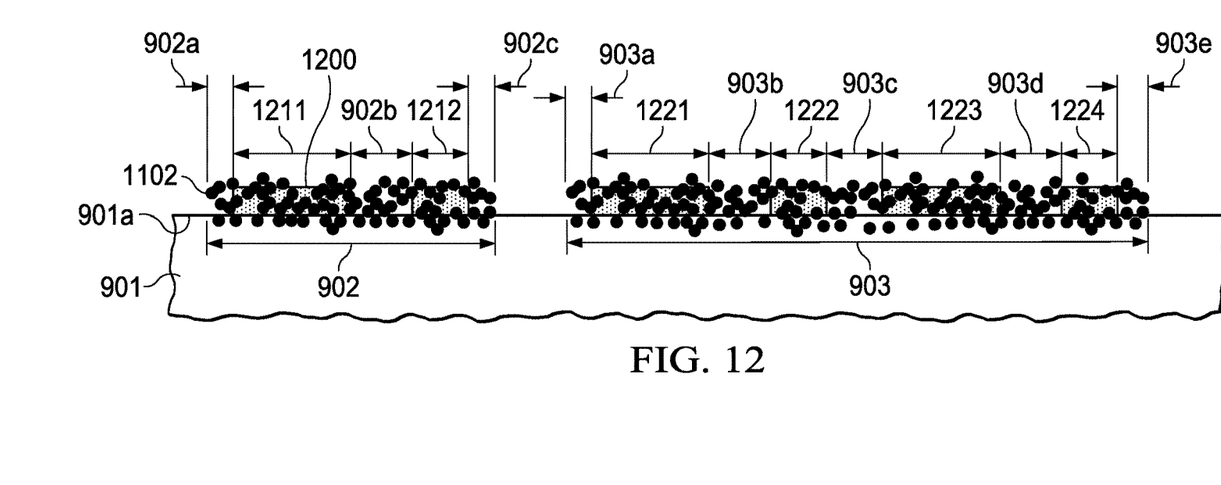
FIG. 12 illustrates the transmutation of the electrical non-conductance of selected zones of the sintered nanoparticle layer into electrical conductance, by depositing a volatile reducing agent according to an embodiment of the invention.
Figure 13:
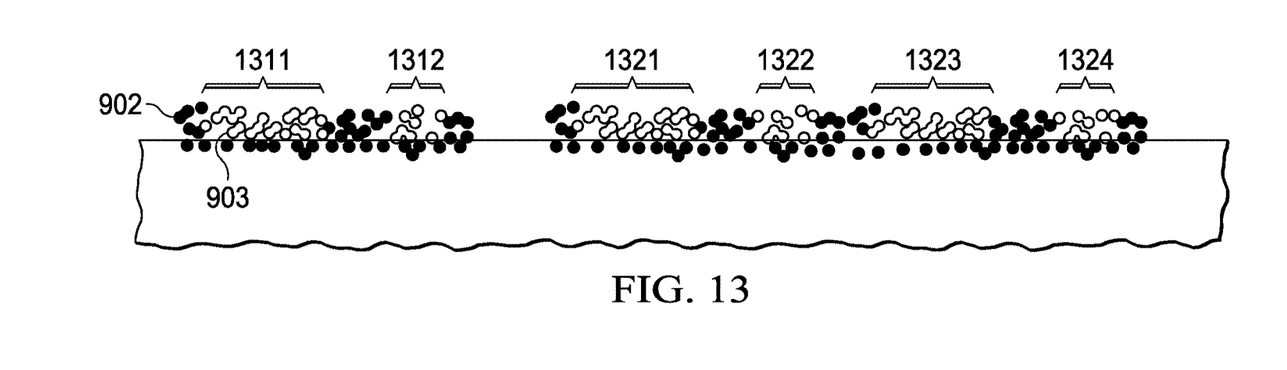
FIG. 13 illustrates the completed transmutation in selected zones of sintered electrically non-conductive nanoparticles into sintered electrically conductive nanoparticles according to an embodiment of the invention.

FIGS. 12 and 13 illustrate an example of a selective deposition, or deposition through a mask, of a chemical agent, followed by evaporation of the agent. In FIG. 12, islands (of lengths 902 and 903) of sintered electrically non-conductive nanoparticles 1102 have been formed on surface 901*a* of substrate 901. In this example, a volatile reducing agent 1200 is selectively deposited into zones designated 1211 and 1212 of the nanoparticle island of length 902, and into zones 1221, 1222, 1223, and 1224 of the nanoparticle island of length 903. As FIG. 12 shows, reducing agent 1200 is distributed between, and surrounds, the sintered nanoparticles 1102 of the selected zones. Only certain other zones of the original non-conductive nanoparticles 1102 remain non-conductive; in island 902, the remaining non-conductive zones are designated 902*a*, 902*b*, and 902*c*, and in island 903, they are designated 903*a*, 903*b*, 903*c*, 903*d*, and 903*e*.

In FIG. 13, the transmutation, or transformation, of nanoparticles in selected zones has been completed from the original electrically non-conductive characteristic to electrically conductive characteristic. The sintered nanoparticles marked 902 are still in their electrically non-conductive state, while the sintered nanoparticles 903 in zones 1311, 1312, 1321, 1322, 1323, and 1324 are in the electrically conductive state; the nanoparticles in those zones may now be called conductors. The volatile material 1200, which served as the reducing agent, is eliminated for instance by evaporation. By the selective reduction process, a nanoparticle adhesion layer is created, which is patterned into contiguous zones of electrical insulation and electrical conductance.

Figure 14:
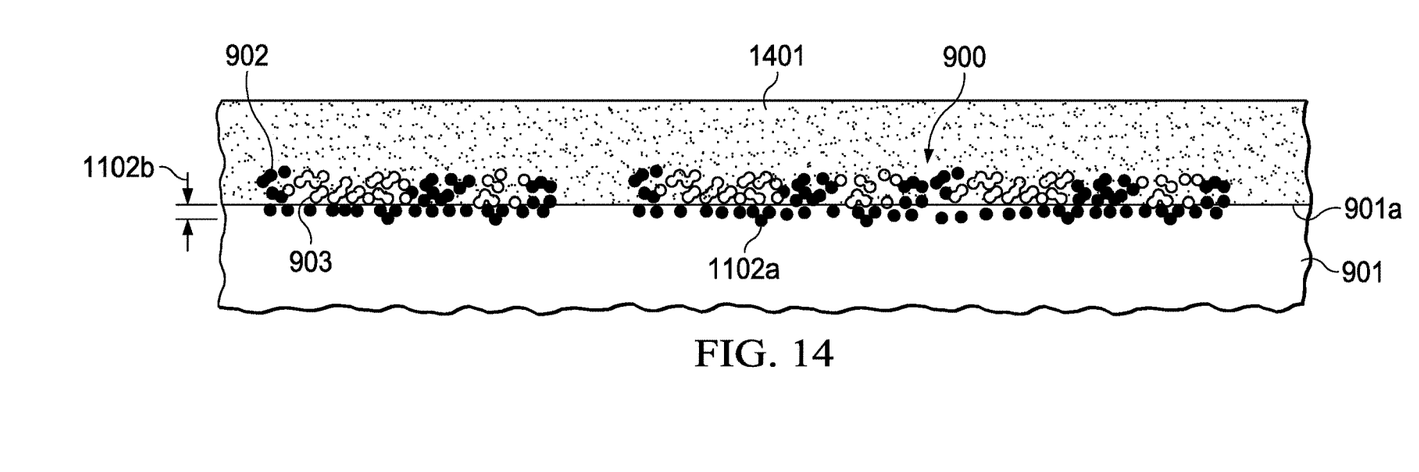
FIG. 14 illustrates the encapsulation of the additive layer by a packaging compound, which fills the voids of the additive layer according to an embodiment of the invention.

During step 805 of the process shown in FIG. 8, the solid patterned nanoparticle layer, together with at least portions of the substrate of first material, are encapsulated into a package of a third material. The process is illustrated in FIG. 14, wherein the polymeric compound s denoted 1401. A method for encapsulation by a polymeric compound is transfer molding technology using a thermoset epoxy-based molding compound. Since the compound has low viscosity at the elevated temperature during the molding process, the polymeric compound can readily fill any pores/voids of the patterned nanoparticle adhesion layer. The filling of the pores/voids by polymeric material takes place for any pores/voids, whether they are arrayed in an orderly pattern or in a random distribution, and whether they are shallow or in a random three-dimensional configuration including pores/voids resembling spherical caverns with narrow entrances.

After the compound has polymerized and cooled down to ambient temperature, the polymeric compound 1401 in the package as well as in the pores/voids is hardened. After hardening of the plastic material, the polymeric-filled pores/voids represent a strong anchor of the package in the patterned nanoparticle layer, giving strength to the interface of package (third material) and the patterned nanoparticle film layer. In addition, as mentioned above, the nanoparticle layer is anchored in metallic substrate 901 by metal inter-diffusion 1102a. Together, the overall adhesion between the plastic package 11401 and the metallic substrate 901 is improved while the adhesive nanoparticle layer offers selective electrical conductance for signal routing. Adhesion improvements of an order of magnitude have been measured.

Figure 15:
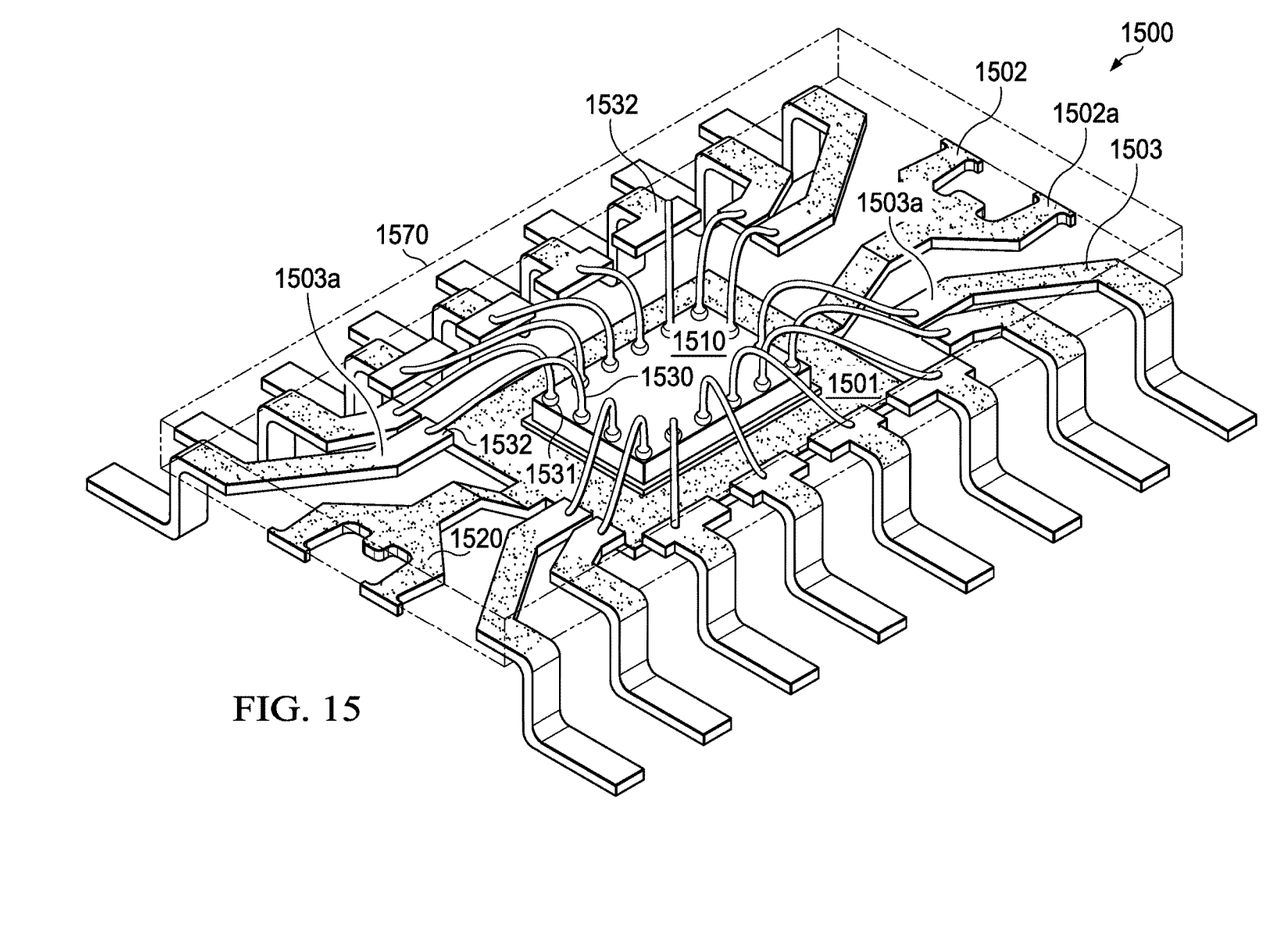
FIG. 15 illustrates a packaged semiconductor device with leadframe, wherein portions of the leadframe are covered by a nanoparticle adhesion layer patterned into zones of electrical conductance and insulation according to an embodiment of the invention.

FIG. 15 illustrates an embodiment of a semiconductor device 150 using enhanced adhesion by a nanoparticle adhesion semiconductor layer patterned into zones of electrical conductance and insulation. The device includes a metallic leadframe and a plastic package wherein the leadframe includes a pad 1501 for assembling a semiconductor chip 1510, tie bars 1502 connecting pad 1501 to the sidewall of the package, and a plurality of leads 1503. The chip terminals are connected to the leads 1503 by bonding wires 1530, which commonly include ball bond 1531 and stitch bond 1532. In the example of FIG. 15, leads 1503 are shaped as cantilevered leads; in other embodiments, the leads may have the shape of flat leads as used in Quad Flat No-Lead (QFN) devices or in Small Outline No-Lead (SON) devices. Along their longitudinal extension, tie bars 1502 include bendings and steps, since pad 1501 and leads 1503 are not in the same plane. In other devices, tie bars 1502 are flat and planar, because pad 1501 and leads 1503 are in the same plane.

In FIG. 15, the portions of the leadframe which are included in the zones of electrical non-conductance of the nanoparticle adhesive layer are marked by dashing 1520. On the other hand, the leadframe portions 1503a included in the zones of electrical conductance are free of dashing. Since the semiconductor device 1500 includes a package 1570 for encapsulating p 1510 and wire bonds 1530, any pores/voids of the patterned layer are filled by the polymeric compound. Preferably, package 1570 is made of a polymeric compound such as an epoxy-based thermoset polymer, formed in a molding process, and hardened by a polymerization process. The adhesion between the polymeric compound of package 1570 and the leadframe is improved by the patterned nanoparticle layer. Other devices may have more and larger areas of the leadframe covered by the porous bi-layer nanoparticle film.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example in semiconductor technology, the invention applies not only to active semiconductor devices with low and high pin counts, such as transistors and integrated circuits, but also to combinations of active and passive components on a leadframe pad.

As another example, the invention applies not only to silicon-based semiconductor devices, but also to devices using gallium arsenide, gallium nitride, silicon germanium, and any other semiconductor material employed in industry. The invention applies to leadframes with cantilevered leads and to QFN and SON type leadframes.

As another example, the invention applies, in addition to leadframes, to laminated substrates and any other substrate or support structure, which is to be bonded to a non-metallic body.

It is therefore intended that the appended claims encompass any such modifications or embodiments.

We claim:

1. A device comprising:
  a substrate of a first material;
  a nanoparticle layer on top of and in contact with a surface of the substrate, a region adjoining the substrate surface comprising a mixture of the nanoparticles in the first material;
  wherein the nanoparticle layer comprises contiguous zones alternatingly having electrical conductance and electrical insulation; and
  a second material making contact with the nanoparticle layer wherein the second material fills voids in the nanoparticle layer.

2. The device of claim 1 wherein the substrate is a laminated substrate including metallic regions.

3. The device of claim 1 wherein the substrate of the first material is one or more surfaces on a metallic leadframe.

4. The device of claim 3 wherein the first material of the metallic leadframe is selected from a group including copper, copper alloys, aluminum, aluminum alloys, iron-nickel alloys, and Kovar™.

5. The device of claim 4 wherein the metallic leadframe further includes plated layers selected from a group including nickel, palladium, gold, and tin.

6. The device of claim 1 wherein the zones of electrical conductance include nanoparticles having metallic surfaces, the zones of electrical insulation include nanoparticles having oxidized surfaces, and the mixture of diffused nanoparticles includes metals.

7. The device of claim 6 wherein the nanoparticles having metallic surfaces are selected from a group including metal nanoparticles, metal-coated polymeric nanoparticles, metal-coated ceramic nanoparticles, and metal-coated plastic nanoparticles.

8. The device of claim 1 wherein the zones of electrical conductance include nanoparticles having reduced surfaces, the zones of electrical insulation include nanoparticles having non-conductive surfaces, and the mixture of nanoparticles includes non-conductive molecules.

9. The device of claim 8 wherein the nanoparticles having non-conductive surfaces are selected from a group including metal oxide nanoparticles, polymeric compound nanoparticles, nitrogen compound nanoparticles, and electrically conducting nanoparticles coated with polymerics, oxides, and carbon compounds.

10. The device of claim 1 wherein the second material includes a polymeric compound such as an epoxy-based molding compound.

11. A method for substrate modification comprising:
providing a substrate of a first material, the substrate having a first surface;
depositing onto the first surface a layer of paste, the layer of paste including nanoparticles of a second material, wherein the second material is electrically conductive;
applying energy to increase the temperature for sintering together the nanoparticles of the second material;
transmuting the electrical conductance of selected zones of the layer to electrical insulator by selective oxidation; and
encapsulating the nanoparticle layer and at least portions of the substrate in a third material, wherein the third material adheres to at least portions of the nanoparticle layer.

12. The method of claim 11 wherein the second material is selected from a group including metal nanoparticles, metal-coated polymeric nanoparticles, metal-coated ceramic nanoparticles, and metal-coated plastic nanoparticles.

13. The method of claim 11 wherein the selective oxidation employs a selective technique chosen from a group including heating, exposing to oxidizing atmosphere, exposing to oxidizing substances, and depositing a volatile oxidizing agent.

14. The method of claim 11 wherein the selective oxidation by exposing to oxidizing substances employs masking or selective deposition.

15. The method of claim 11 wherein the package of the third material includes a polymeric compound such as an epoxy-based molding compound.

16. A method for substrate modification comprising:
providing a substrate of a first material, the substrate having a first surface;
depositing onto the first surface a layer of a paste, the paste including nanoparticles of a second material wherein the second material is electrically non-conductive;
applying energy to increase a temperature for sintering together the nanoparticles of the second material;
transmuting the electrical non-conductance of selected zones of the layer to electrical conductance by selective reduction or ablation; and
encapsulating the layer and at least portions of the substrate in third material wherein the third material adheres to at least portions of the nanoparticle layer.

17. The method of claim 16 wherein the second material is selected from a group including metal oxide nanoparticles, polymeric compound nanoparticles, nitrogen compound nanoparticles, and electrically conducting nanoparticles coated with polymerics, oxides, and carbon compounds.

18. The method of claim 16 wherein the selective reduction or ablation employs a technique chosen from a group including selective exposure to reducing atmosphere, selective deposition of a volatile reducing agent, and selective heating for ablating non-conductive coatings.

19. The method of claim 16 wherein the selective technique includes the use of a mask.

20. The method of claim 16 wherein the third material includes a polymeric compound such as an epoxy-based molding compound.

* * * * *